United States Patent [19]

Esquivel et al.

[11] Patent Number: 4,951,103
[45] Date of Patent: Aug. 21, 1990

[54] FAST, TRENCH ISOLATED, PLANAR FLASH EEPROMS WITH SILICIDED BITLINES

[75] Inventors: Agerico L. Esquivel, Dallas; Allan T. Mitchell, Garland, both of Tex.

[73] Assignee: Texas Instruments, Incorporated, Dallas, Tex.

[21] Appl. No.: 202,766

[22] Filed: Jun. 3, 1988

[51] Int. Cl.$^5$ .............................................. H01L 29/78
[52] U.S. Cl. .................................... 357/23.5; 357/59; 357/45; 357/67; 357/23.14
[58] Field of Search ..................... 357/23.5, 45, 67 S, 357/59 I, 23.14

[56] References Cited

U.S. PATENT DOCUMENTS

| | | | |
|---|---|---|---|
| 4,442,447 | 4/1985 | Ipri et al. | 357/23.5 X |
| 4,597,000 | 6/1986 | Adam | 357/23.5 |
| 4,597,060 | 6/1986 | Mitchell et al. | 357/23.5 X |
| 4,616,340 | 10/1986 | Hayashi et al. | 357/23.5 X |
| 4,698,900 | 10/1987 | Esquivel | 357/23.5 X |
| 4,714,951 | 12/1987 | Baudrant et al. | 357/59 I X |
| 4,833,514 | 5/1989 | Esquivel et al. | 357/23.5 X |

FOREIGN PATENT DOCUMENTS 2708599 9/1977 Fed. Rep. of Germany ..... 357/23.5

OTHER PUBLICATIONS

Chakraarti et al., "Memory Access Line," *IBM Technical Disclosure Bulletin*, vol. 20, No. 10, Mar. 1978, pp. 3847-3848.

*Primary Examiner*—William Mintel
*Attorney, Agent, or Firm*—Melvin Sharp; James T. Comfort; Douglas A. Sorensen

[57] ABSTRACT

A non-volatie cross-point memory cell array comprises a trench isolated cross-point array of memory cells (10), which are electrically programmable and electrically FLASH eraseable, having diffused regions (28) operable as bitlines, each diffused region (28) traversed by a plurality of control gates (54) operable as wordlines. The diffused regions (28) undergo a silicidation process to decrease their resistivity, and thereby increase the speed of the memory cell array. A tunnel oxide (18) is provided for electrical erasing and programming. Planarized, high quality insulating regions (40, 36), such as dichlorosilane oxide, buttress the floating gate (20) to isolate the bitlines form the wordlines and to improve isolation between the pass gate and the floating gate. A planar structure of the memory cell (10) provides flat topography ideal for three dimensional stacked structures. Trench isolation regions (56) reduce bitline capacitance, thereby increasing programming speed.

16 Claims, 4 Drawing Sheets

FAST, TRENCH ISOLATED, PLANAR FLASH EEPROMS WITH SILICIDED BITLINES

TECHNICAL FIELD OF THE INVENTION

This invention pertains in general to integrated circuits, and more particularly to an EPROM, FLASH EEPROM, or EEPROM device circuit with trench isolation and silicided bitlines.

BACKGROUND OF THE INVENTION

While an EPROM is an Electrically Programmable Read Only Memory device that is ultra-violet (UV) eraseable, a more recent non-volatile memory device has been developed called a FLASH EEPROM which is acronym for an Electrically Programmable and Electrically Bulk Eraseable Read Only Memory. The FLASH EEPROM differs from the EPROM in that it is electrically eraseable instead of UV eraseable, and differs from the standard EEPROM (Electronically Programmable and Electrically Eraseable Read Only Memory) in that the FLASH EEPROM is bulk eraseable whereas the standard EEPROM is byte eraseable. There are other differences between the three devices. Typically, an EPROM has the smallest cell size of the three, ranging between 10 to 60 square microns and hence is capable of high density, up to four megabits. An EEPROM, on the other hand, has the largest cell size of the three, ranging from 100 to 200 square microns and hence does not have a very high density. A FLASH EEPROM cell size currently is intermediate between the EPROM and standard EEPROM, ranging between 30 to 100 square microns, hence is capable of densities higher than that of a standard EEPROM. At the present stage of development, the electrical write and electrical erase cycling endurance of the FLASH EEPROM is less than that of the standard EEPROM, although progress is being made. The structures between the three devices originally were quite different, since the EPROM had a single transistor cell, while the EEPROM had two transistor cells. A FLASH EEPROM, on the other hand, has one merged transistor cell consisting of two transistors in series, a pass gate and a floating gate memory cell. Present trends in cell development are leading to fewer differences in structure between the three types of devices Thus the present invention, although specifically a FLASH EEPROM, can also be referred to as variants of the EPROM or standard EEPROM.

Traditionally, FLASH EEPROMS, EPROMs, EEPROMs, and EPALs have been implemented using a non-planar FAMOS technology. The non-planar technology, which does not use a cross-point cell structure with buried N+ bitlines, has several inherent problems First, because the bitlines used in the non-planar technology are not buried, they must be noncontinuous, each bitline covering only two or three cells. Consequently, the non-planar technology requires many contacts to be made to the large number of bitlines used therein. As a result of the numerous contacts required, the density of the non-planar technology is limited. Second, because of its uneven profile, the non-planar technology is not suited for stacked structures, in which one or more layers of circuitry are placed on top of the first memory array.

Many of the shortcomings of non-planar technology have been addressed in U.S. Pat. No. 4,597,060 to Mitchell, which describes a method of forming a planarized, cross-point FAMOS cell. The planar technology allows many cells to be disposed upon a continuous bitline, limited only by the sheet resistance and capacitance of the bitline, thereby reducing the number of contacts. The planar technology also provides for higher densities and stacked structures.

However, due to the relatively long bitlines, the speed of the device is reduced due to bitline resistance and bitline capacitance. Since speed is an important design criterion, the reduced speed represents a serious shortcoming in the art.

Therefore, a need has arisen for a planar FAMOS technology for use in EPROMs, EEPROMs, FLASH EEPROMs, EPALs, and other devices using similar memory structures, in which the speed of the device is increased.

SUMMARY OF THE INVENTION

In accordance with the present invention, a cross-point non-volatile memory cell array is provided which substantially eliminates or prevents the disadvantages and problems associated with prior non-volatile memory devices.

In a first aspect of the present invention, a trench-isolated, cross-point memory cell array is provided wherein a floating gate is formed over a semiconductor body and diffused regions, acting as buried bitlines, are formed in the semiconductor body. A silicidation process is performed on the bitlines wherein a metal, such as titanium, is compounded with the semiconductor material in the diffused region to form a low resistance path. Planar, high quality dielectric regions are formed over the diffused regions and adjacent to either side of the floating gates. Wordlines are formed over the floating gates and on top of the planar dielectric regions in a direction perpendicular to the bitlines. Trench isolation regions are formed between bitlines. A single bitline may extend through sixty-four or more memory cells but contacts are usually made every sixteenth cell.

This aspect of the present invention provides the technical advantage of low resistance bitlines to increase the speed of the device when using bitlines extending through multiple memory cells. Since the longer bitline reduces the number of contacts needed, the density of the memory array may be increased without sacrificing speed. Furthermore, the trench isolation regions reduce bitline capacitance, thereby providing additional speed.

In a second aspect of the present invention, floating gates are formed over the semiconductor body, being isolated therefrom by an oxide layer having a tunnel region of reduced thickness to provide tunneling injection of charges into the floating gate, and to electrically erase the same charges. A pass gate to control the electrical erase is formed adjacent to the floating gate and diffused regions are formed in the semiconductor body at the sides of the gates. The diffused regions are trench isolated and silicided for low resistance.

This aspect of the present invention provides a small cell size for higher cell density, while providing fast programming and electrical Flash erasing.

In a third aspect of the present invention, a trench-isolated, cross-point memory cell array is provided wherein a floating gate is formed over a semiconductor body and diffused regions, acting as buried bitlines, are formed in the semiconductor body as in the first two aspects of the present invention. However, to allow an even higher cell density relative to the first and second aspects of the present invention, the tunnel window, small tunnel oxide within the window, and the pass gate, as described in the first and second aspects of the present invention, are deleted. To provide a Fowler-Nordheim ("cold" electron) programming and erase, the FAMOS gate oxide, under the floating gate, of 400 angstroms is replaced by a high quality tunnel oxide of 100 angstroms or less, either thermally grown or deposited by chemical vapor deposition (CVD) methods.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE INVENTION

The preferred embodiment of the present invention is best understood by referring to FIGS. 1–15 of the drawings, like numerals being used for like and corresponding parts of the various drawings.

Figure 1:
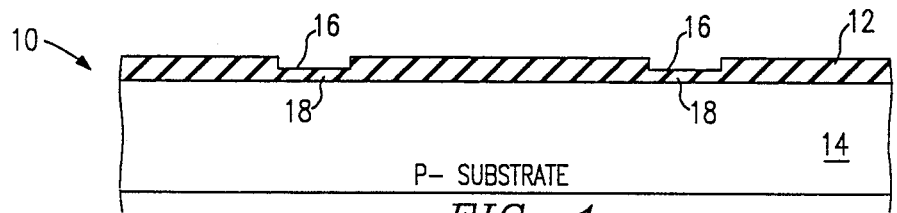
FIG. 1 illustrates a cross-sectional side view of the memory cell of the present invention after a first processing stage.

FIG. 1 illustrates a cross-sectional view of a memory cell 10 of the present invention after a first processing stage. A gate oxide 12 is disposed over a P-substrate 14, typically by using thermal oxidation of the substrate 14. The gate oxide 12 has a thickness of approximately 350–400 angstroms. A tunnel 16 is formed in the gate oxide 12 such that the tunnel oxide 18 has a thickness of approximately 100. angstroms. The tunnel 16 may be formed by patterning and etching the gate oxide 12 to the underlying P- substrate 14. The tunnel oxide 18 can be regrown in the tunnel 16 to a thickness of 100 angstroms.

Figure 2:
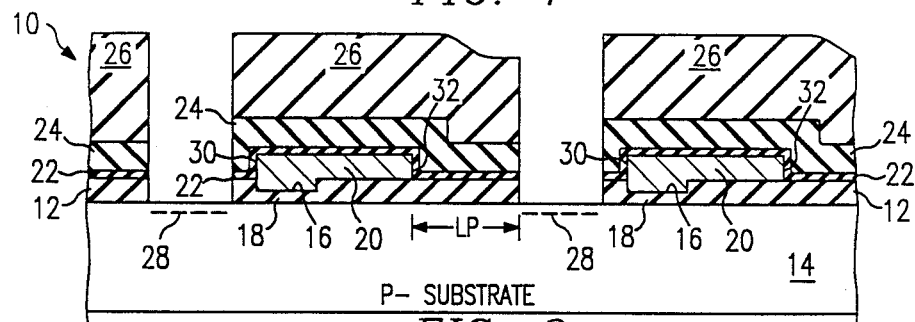
FIG. 2 illustrates a cross-sectional side view of the memory cell of the present invention after a second processing stage.

FIG. 2 illustrates a cross-sectional view of the memory cell 10 of the present invention after a second processing stage. A floating gate 20 is formed over the tunnel oxide 18 and gate oxide 12 by depositing a layer of polysilicon. Subsequently, the polysilicon is doped in order to render it conductive. The doped polysilicon is patterned and plasma etched to define the floating gate 20. After the floating gate pattern is stripped, the floating gate 20 is oxidized at 900° C. in an oxygen ambient to provide a thermal oxide seal 22 of 250–300 angstroms over the polysilicon. An LPCVD oxide layer 24 of 3000A is deposited over the floating gate 20 to protect it from a later silicidation process. This LPCVD oxide layer 24 is densified at 900° C. in an oxygen ambient.

After deposition and UV hardening of a photoresist pattern 26 for the source/drain implant, the LPCVD oxide layer 24 of 3000A, the thermal oxide seal 22 of 250–300 angstroms and underlying oxide layer 12 are etched over the source/drain regions 28. The source/drain implant pattern 26 is aligned to within 0.25 um of the edge 30 of the poly floating gate 20 closest to the tunnel oxide, such that during the subsequent source/drain anneal, the floating gate edge 30 overlaps the diffusion region of the source/drain regions 28.

Figure 6:
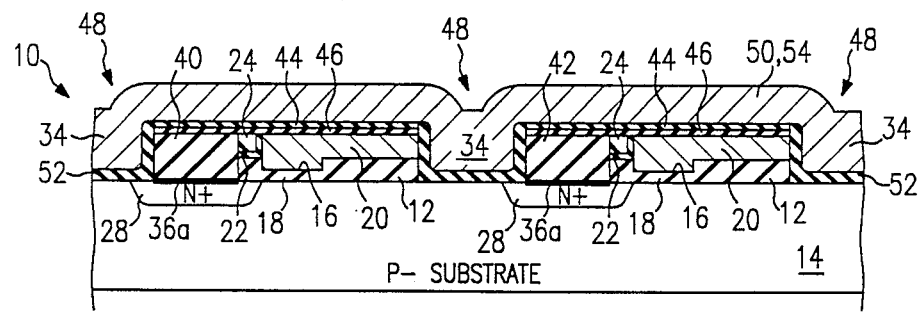
FIG. 6 illustrates a cross-sectional side view of the memory cell of the present invention after a sixth processing stage.

The source/drain implant pattern 26 overlaps the other edge 32, of the poly floating gate 20 (which edge 32 is farthest away from the tunnel oxide) by a distance LP which defines the length of the pass gate 34 defined in subsequent steps (See FIG. 6). Next, the source/drain regions 28 are implanted with arsenic or some other suitable N+ dopant. After the source/drain pattern 26 is stripped, the effects of the N+ implant on the source/drain regions 28 are annealed at 900° C. in an inert gas ambient, and the buried N. bitlines 28 (source/drain regions 28) are formed.

Figure 3:
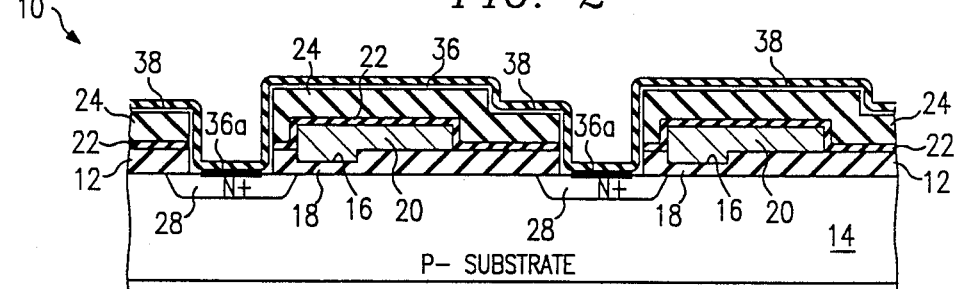
FIG. 3 illustrates a cross-sectional side view of the memory cell of the present invention after a third processing stage.

FIG. 3 illustrates a cross-sectional view of the memory cell 10 of the present invention after a third processing stage. Just prior to the deposition of the refractory metal, such as titanium, a deglaze in 10% HF is performed on the source/drain regions 28 to remove any native oxide. Next, a refractory metal, such as pure titanium 36, is sputtered over the top surface to a thickness of approximately 900 angstroms. The oxide layer 24 spaces the titanium 36 from the floating gate 20 to prevent shorting. A cap oxide 38 is deposited over the titanium 36 to protect it from oxidation during the alloying of the titanium 36 with the silicon (with which the titanium is in contact). The titanium 36 that is not in contact with the silicon remains unreacted. The result of the alloying is the formation of the compound titanium silicide 36a ($TiSi_2$) which has a low contact resistance.

The cap oxide 38 over the source/drain regions 28 is then removed and the unreacted titanium 36 is stripped, leaving the $TiSi_2$ layer 36a at the top of the source/drain regions 28. Thereafter, the $TiSi_2$ layer 36a is annealed in an inert atmosphere at a temperature of 800° C. for thirty minutes.

Contacts to the silicided bitline 28 can be made every sixteenth wordline. For the silicidation process, refractory metals, such as titanium, tungsten, or molybdenum can be used since these metals, when alloyed with silicon, provide low contact resistances.

Figure 4:
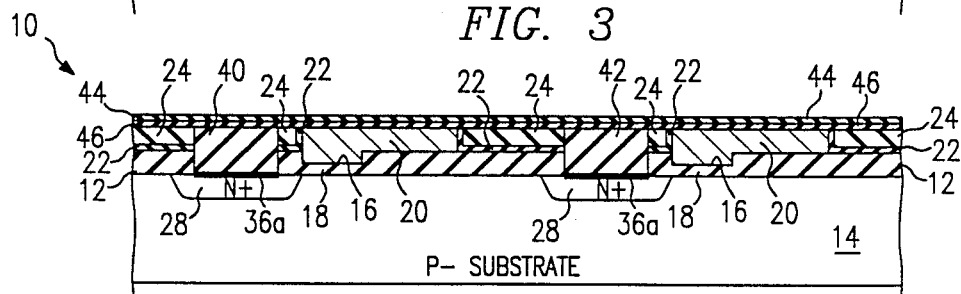
FIG. 4 illustrates a cross-sectional side view of the memory cell of the present invention after a fourth processing stage.

FIG. 4 illustrates a cross-section of the memory cell 10 of the present invention after a fourth processing stage. The areas between the floating gates 20 are filled with a high quality dielectric, 40 and 42, such as DCS+N$_2$O (dichlorosilane oxide grown in an N$_2$O ambient). The DCS+N$_2$O oxide is typically deposited over the surface of the integrated circuit and planarized to the level of the floating gate 20. The resulting planar insulating regions 40 and 42 act as a dielectric for the N+ bitlines 28 and as an insulator between the floating gate 20 and other conducting regions to be formed in later steps. An interlevel dielectric is now deposited on top of the floating gate 20 and the planar insulating regions 40 and 42. This bilayer, interlevel dielectric consists of a low pressure CVD oxide layer 46 and a low pressure CVD nitride layer 44.

Figure 5:
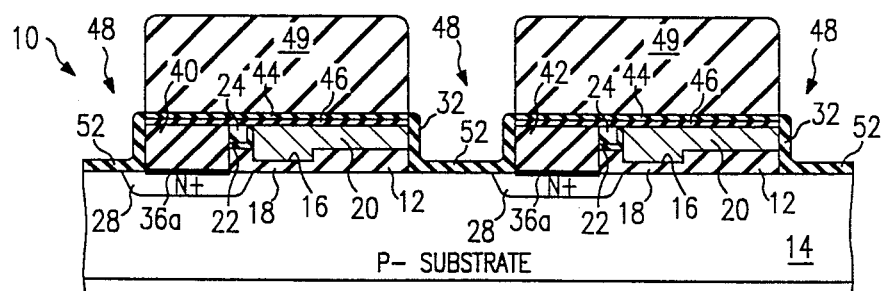
FIG. 5 illustrates a cross-sectional side view of the memory cell of the present invention after a fifth processing stage.

FIG. 5 illustrates a cross-section of the memory cell 10 of the present invention after a fifth processing stage. At this step, an opening 48 is formed in a photoresist layer 49 to provide an opening for the pass gate 34 through the oxide layers adjacent to floating gates 20. The opening or window 48 is formed by plasma etching oxide layers 22 and 24 and portions of planarized oxides 40 and 42 in preparation for the deposition of a polysilicon 50 (See FIG. 6). After the pass gate opening resist 49 is stripped, a gate oxide 52 is grown over the exposed silicon substrate 14 and the vertical sides 32 of the polysilicon floating gates 20. The gate oxide 52 will insulate the floating gate 20 and silicon 14 from the pass gate 34 to be deposited in the next step.

FIG. 6 illustrates the memory cell 10 of the present invention after a sixth processing stage. A polysilicon layer 50 is deposited over the cell 10 and into the windows 48 where the pass gate 34, is formed. The polysilicon layer 50 is doped to render it conductive, and then is patterned. The polysilicon 50 is subsequently etched to define the control gates 54 and pass gates 34. The purpose of the pass gate 34 is to prevent the cell from being programmed into the depletion mode after an electrical erase and to prevent punch-through between source and drain. . The plasma etch which defined the control and pass gates 54 and 34 is extended to form the trench bitline isolation regions 56, which lie between the control gates 54 and bitlines 28. This plasma etch also completes the formation of the floating gates 20 by etching layer 20 between control gates 54. Floating gates 20 are exposed to the trench etch between pass gates 54. The trench isolation regions 56 are illustrated in greater detail in connection with FIG. 7.

After performing the trench isolation etch, the control gate pattern is stripped and the isolation trenches are refilled with a dielectric. Trench isolation in conjunction with planar transistors is described in detail in U.S. patent application Ser. No. 122,952 to Esquivel et al, filed Nov. 19, 1987, which is incorporated herein by reference. A more detailed description of trench formation is described in U.S. Pat. No. 4,698,900 to Esquivel, which is also incorporated herein by reference. A channel stop implant may be used on the trench sidewalls to increase the electrical isolation provided by the trench isolation regions.

Figure 7:
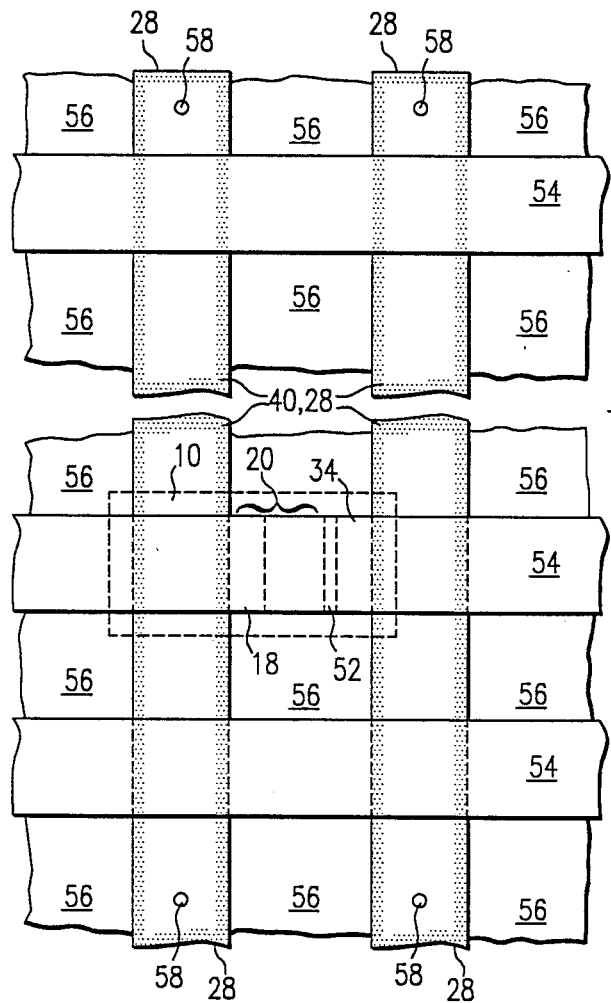
FIG. 7 illustrates a top plan view of the memory array of the present invention.

FIG. 7 illustrates a top plan view of a plurality of cross-point memory cells 10 in a cross-point array. Control gates 54 are disposed substantially perpendicular to bitlines 28 formed beneath the planar isolator regions 40, 42. As shown in phantom, the floating gate 20 and pass gate 34 lie between bitlines 28. The trench isolation regions 56 are formed in the area not covered by either a wordline 54 or a bitline 28. Contacts 58 are formed at the ends of the bitlines 28 for applying a voltage across an addressed bitline. Up to sixteen control gates 32 may traverse a bitline 28 to form sixteen memory cells 10.

The memory cell 10 of the present invention has the advantage that silicided bitlines increase the speed at which the memory cell may be addressed by reducing the bitline resistance. Furthermore, the tunnel oxide provides Fowler-Nordheim tunneling ("cold" electrons) for programming and erasing instead of avalanche electron injection ("hot" electrons) which tend to degrade the oxide. The trench isolation further improves programming speeds by reducing bitline capacitance.

It should be noted that the present invention is adaptable to FLASH EEPROMs, UV Eraseable EPROMs, EEPROMs, FAST EPROMs, EPALs and to other devices incorporating EPROMs, EEPROMs or FLASH EEPROMS.

Figure 8:
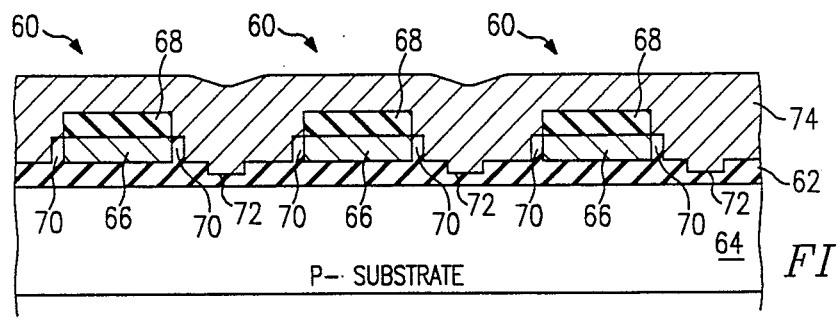
FIG. 8 illustrates a cross-sectional side view of a second embodiment of the memory array of the present invention after a first processing stage.

FIGS. 8-13 illustrate a second embodiment of the present invention capable of high densities. In FIG. 8, a cross-sectional view of the memory cell 60 is illustrated after a first processing stage. A gate oxide 62 is formed over a P- silicon substrate 64, typically through thermal oxidation of the substrate 64. A layer of polysilicon 66 is formed over the gate oxide 62 and is doped. A layer of TEOS oxide 68 is formed over the polysilicon layer. The polysilicon and TEOS oxide layers are patterned and etched to form pass gates 66 and associated oxide masks 68. Sidewall oxide regions 70 are formed on the sides of the pass gate 66, typically by using thermal oxidation. A tunnel oxide 72 is formed as described in connection with FIG. 1. Thereafter, a polysilicon layer 74, or other conductive layer is formed over and between the pass gates 66. If polysilicon layer 74 is used, it is then doped to render it conductive.

Figure 9:
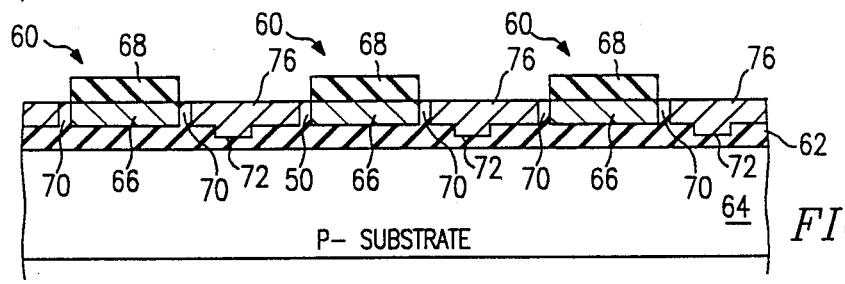
FIG. 9 illustrates a cross-sectional side view of a second embodiment of the memory array of the present invention after a second processing stage.

Referring now to FIG. 9, the polysilicon layer 74 is planarized to form floating gates 76 between pass gates 66, and being separated from the pass gates 66 by sidewall oxide regions 70. The oxide masks 68 are then removed.

Figure 10:
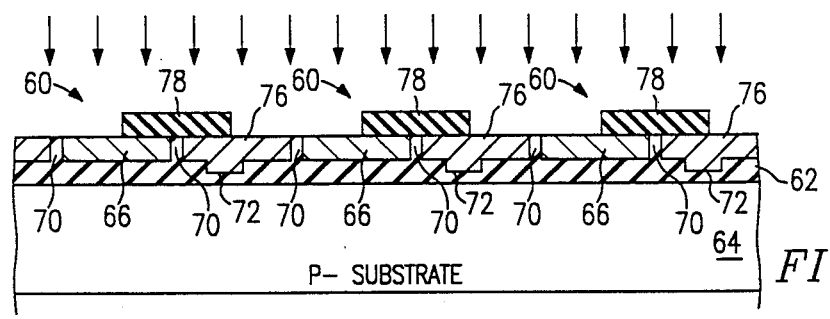
FIG. 10 illustrates a cross-sectional side view of a second embodiment of the memory array of the present invention after a third processing stage.
Figure 11:
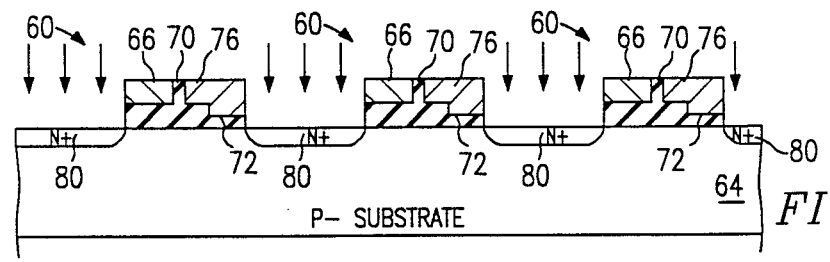
FIG. 11 illustrates a cross-sectional side view of a second embodiment of the memory array of the present invention after a fourth processing stage.

FIG. 10 illustrates a cross-sectional view of the memory cell of the present invention after a third processing stage. After removal of the oxide masks 68, photoresist masks 78 are formed over the pass gates 66 and floating gates 76. An etch is performed, thereby reducing the size of the pass gate 66 and floating gate 76, and exposing the portions of the substrate 64 not covered by the photoresist masks, as illustrated in connection with FIG. 11. The exposed silicon is implanted with arsenic or another suitable dopant to form the bitlines 80 acting as the source/drain regions of the individual memory cells 60. Thereafter, the bitlines 80 undergo a silicidation process as described in connection with FIG. 3 hereinabove to form silicided bitlines 81, shown in FIG. 12.

Figure 12:
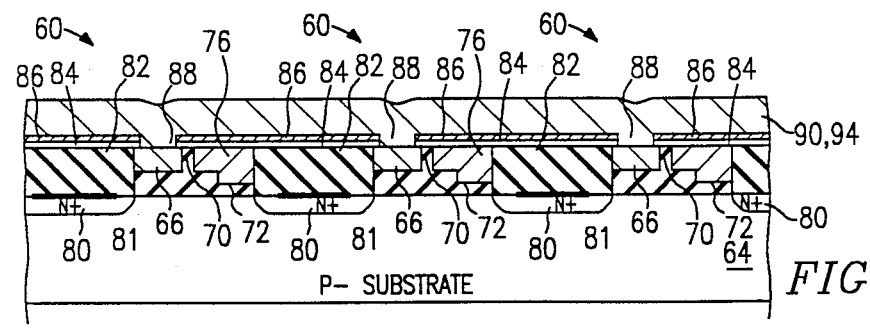
FIG. 12 illustrates a cross-sectional side view of a second embodiment of the memory array of the present invention after a fifth processing stage.

FIG. 12 illustrates a cross-sectional view of the present invention after a fifth processing stage. After silicidation to form the silicided bitlines 81, an oxide layer is formed over the structure, and is planarized to form isolating region 82 over the bitline 80. An ILO layer 84 and ILN layer 86 are formed on top of the structure to provide vertical isolation. Windows 88 are formed through the ILO 84 and ILN 86 layers exposing the pass gate 66 therebelow. A conducting layer 90 is formed over the structure, contacting the pass gate 66 through the window 88. The conducting layer 90 may be either a metal or a doped polysilicon layer. The polysilicon layer 90 is etched to form the control gates, followed by a trench isolation etch to form trench isolation regions 92, shown in FIG. 13. A channel stop implant is performed on the trench sidewalls, if desired, and the trenches are refilled as described hereinabove.

Figure 13:
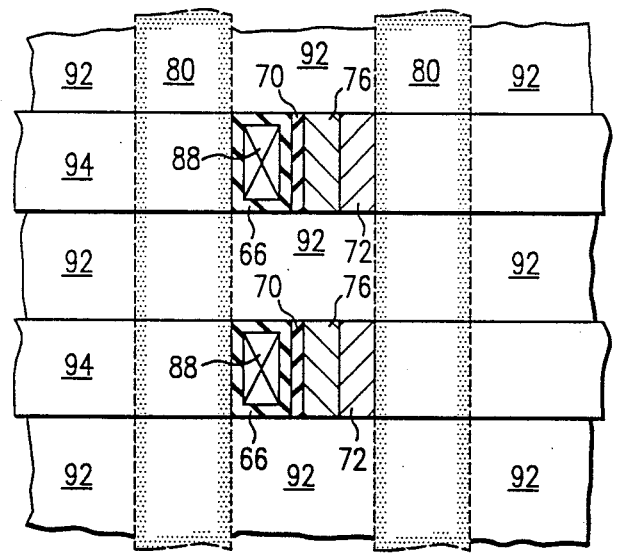
FIG. 13 illustrates a top plan view of the memory cell array of the present invention.

FIG. 13 illustrates a top plan view of the second embodiment of the present invention as shown in connection with a cross-point cell. As illustrated in connection with FIG. 12, the control gates 94 are disposed substantially perpendicular to the bitlines 80. The control gate 94 is connected to the pass gate 66 through the window 88. The pass gate 66 is insulated from the floating gate 76 by the oxide 70. Programming and erase are accomplished through the tunnel oxide 72. Trench isolation regions are indicated by reference number 92.

The second embodiment of the present invention may provide a smaller cell size relative to the first embodiment, thereby providing the technical advantage of increased memory density while maintaining the advantage of high speed described in conjunction with FIGS. 1-7.

Figure 14:
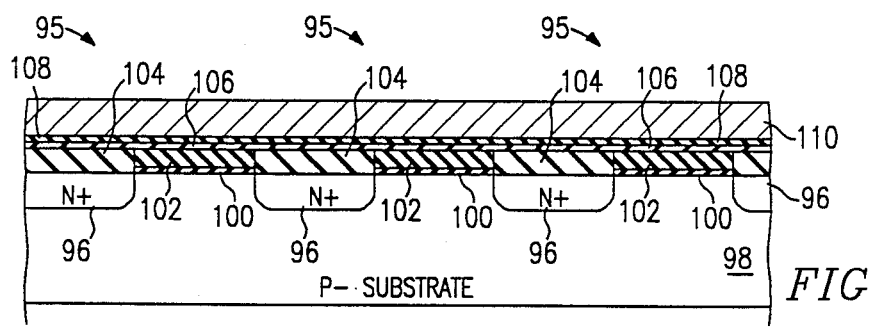
FIG. 14 illustrates a cross-sectional side view of a third embodiment of the memory array of the present invention after completion of processing.
Figure 15:
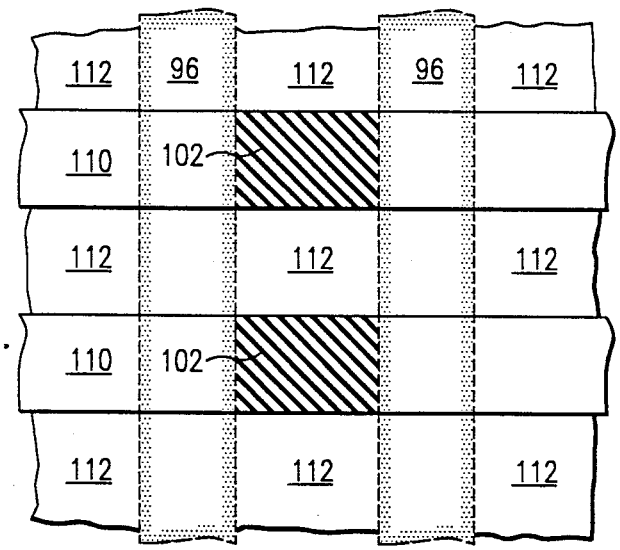
FIG. 15 illustrates a top plan view of the third embodiment of the memory array of the present invention.

FIGS. 14 and 15 illustrates a third embodiment of the present invention capable of even higher cell densities relative to the first and second embodiments. The structure of this planar cell 95 is similar to the planar UV eraseable EPROM cell described in detail in U.S. Pat. No. 4,597,060 to Mitchell and the trench isolated version of the same cell as described in detail in U.S. patent application Ser. No. 122,952 to Esquivel. However, the cell 95 is a trench isolated FLASH EEPROM or EEPROM instead of a trench isolated UV eraseable EPROM. Also, to make the cell function as a FLASH EEPROM, the FAMOS gate oxide which is typically 350 to 400 angstroms thick is replaced by a thinner gate oxide of thickness 100 angstroms or less, using a high quality dielectric, whether thermally grown or deposited by low pressure chemical vapor deposition (LPCVD) methods. This thinner LPCVD oxide permits programming and FLASH erasing by electron tunneling methods. To reduce the cell size further, the pass gates are omitted. FLASH erase is accomplished by a timing method (instead of using the pass gates as control) to prevent erasing the cell into depletion. Single N. diffusions are replaced by multiple diffusions tailored to permit programming and erase by electron tunneling.

In FIG. 14 a cross-sectional view of the memory cell 95 is illustrated after a first processing stage. The detailed processing of the memory cell 95 is similar to that described in U.S. Pat. No. 4,597,060 to Mitchell, with the exception that the gate oxide thickness has been reduced from 400 angstroms to 100 angstroms to allow programming and erase by electron tunneling. The cell 95 comprises diffused regions 96, which will be the buried N+ bitlines, P- silicon substrate 98, the tunnel oxide 100, the N+ doped polysilicon floating gate 102, the planar N+ oxide 104, the interlevel oxide, ILO 106, interlevel nitride, ILN 108, and the second N+ doped polysilicon control gate 110.

FIG. 15 illustrates a top plan view of the third embodiment of the present invention. As illustrated in connection with FIG. 13, the control gates 110 are disposed substantially perpendicular to the bitlines 96. Trench isolation regions, indicated by reference number 112, are formed as described in U.S. patent application Ser. No. 122,952 to Esquivel.

Although the present FLASH EEPROM invention has been described in detail, it should be understood that various changes, substitutions and alterations can be made herein without departing from the spirit and scope of the invention as defined by the appended claims.

What is claimed is:

1. A nonvolatile memory cell, comprising:
   a substrate having a first conductivity type;
   a first diffusion formed in said substrate adjacent to a surface of said substrate, said first diffusion having a second conductivity type;
   a second diffusion formed in said substrate adjacent to said surface of said substrate, said second diffusion having said second conductivity type and being spaced from said first diffusion defining a channel region therebetween;
   a first insulating layer formed on a first portion of said channel region, said first insulating layer extending from said first diffusion, but not extending to said second diffusion;
   a floating gate formed on said first insulating layer;
   a second insulating layer formed on a second portion of said channel region, said second insulating layer extending from said second diffusion to an edge of said first insulating layer;
   a pass gate formed on said second insulating layer;
   a third insulating layer formed on said floating gate; and
   a wordline formed in conductive contact with said pass gate and on said third insulating layer.

2. A nonvolatile memory cell as in claim 1 wherein said first insulating layer is thinner than said second insulating layer.

3. A nonvolatile memory cell as in claim 1 wherein said first and second insulting layers comprise silicon dioxide.

4. A nonvolatile memory cell as in claim 3 where said first insulating layer has a thickness of 100Å.

5. A nonvolatile memory cell as in claim 1 where the top of said pass gate and the top of said third insulating layer are substantially coplanar.

6. A nonvolatile memory cell as in claim 1 wherein said first insulating layer comprises a first portion and a second portion, said first portion being thinner than said second portion.

7. A nonvolatile memory cell as in claim 1 further comprising:
   a first metal silicide layer formed on a surface of said first diffusion; and
   a second metal silicide layer formed on a surface of said second diffusion.

8. A nonvolatile memory array, comprising:
   a substrate having a firs conductivity type;
   a plurality of diffusions formed in said substrate adjacent to a surface of said substrate, said plurality of diffusions formed in parallel strip-s, each of said diffusions separated by a channel region between said strips, and each of said diffusions having a second conductivity type;
   a plurality of wordlines formed on said substrate, said plurality of wordlines formed in strips running perpendicular to said plurality of diffusions;
   a plurality of memory cells, each of said memory cells comprising:

a first insulating layer formed on a first portion of said channel region, said first insulating layer extending from one of said diffusions, but no extending to a neighboring diffusion of one of said diffusions;

a floating gate formed on said first insulating layer;

a second insulating layer formed on a second portion of said channel region, said second insulating layer extending from said neighboring diffusion to an edge of said first insulating layer opposite said one of said diffusions;

a pass gate formed on said second insulating layer, said pass gate in electrical contact with at least one of said wordlines; and a third insulating layer interposed between said floating gate and at least one of said wordlines.

9. A nonvolatile memory array as in claim 8 wherein said first insulating layer is thinner than said second insulating layer.

10. A nonvolatile array as in claim 8 where said first and second insulating layers comprise silicon dioxide.

11. A nonvolatile memory array as in claim 10 where said first insulating layer has a thickness of 100Å.

12. A nonvolatile memory array as in claim 8 where the top of said pass gate and the top of said third insulting layer are substantially coplanar.

13. A nonvolatile memory array as in claim 8 wherein said first insulating layer comprises a first portion and a second portion, said first portion being thinner than said second portion.

14. A nonvolatile memory array as in claim 8 further comprising a plurality of metal silicide layers formed on a surface of aid plurality of diffusions.

15. A nonvolatile memory array as in claim 8 further comprising a plurality of insulating layers formed on the surface of said plurality of diffusions, the top surface of plurality of insulating layers being substantially coplanar with said first insulating layer of said plurality of memory cells.

16. A nonvolatile memory array as in claim 14 further comprising a plurality of insulating layers formed on the surface of said plurality of metal silicide layers, the top surface of plurality of insulating layers being substantially coplanar with said third insulating layer of said plurality of memory cells.

* * * * *